(12) United States Patent
Wang et al.

(10) Patent No.: US 10,866,282 B2
(45) Date of Patent: Dec. 15, 2020

(54) METHOD FOR CALIBRATING CHANNEL DELAY SKEW OF AUTOMATIC TEST EQUIPMENT

(71) Applicant: MONTAGE TECHNOLOGY CO., LTD., Shanghai (CN)

(72) Inventors: Yong Wang, Shanghai (CN); Dongming Lou, Shanghai (CN); Weidong Fan, Shanghai (CN); Ronghui Chen, Shanghai (CN); Meng Mei, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 47 days.

(21) Appl. No.: 16/508,309

(22) Filed: Jul. 11, 2019

(65) Prior Publication Data

US 2020/0018795 A1 Jan. 16, 2020

(30) Foreign Application Priority Data

Jul. 12, 2018 (CN) .......................... 2018 1 0763575

(51) Int. Cl.
*G01R 31/3183* (2006.01)
*G01R 31/319* (2006.01)
(Continued)

(52) U.S. Cl.
CPC ................ *G01R 31/318307* (2013.01); *G01R 31/31726* (2013.01); *G01R 31/31905* (2013.01);
(Continued)

(58) Field of Classification Search
CPC ...... G01R 31/318307; G01R 31/31905; G01R 31/318328; G01R 31/31937;
(Continued)

(56) References Cited

U.S. PATENT DOCUMENTS

| 2012/0313618 A1* | 12/2012 | Phillips | ............... | G01R 31/3191 324/74 |
| 2014/0361798 A1* | 12/2014 | Johnson | ............... | G01R 35/005 324/750.02 |
| 2016/0124066 A1* | 5/2016 | Chen | ................... | G01R 35/005 324/750.02 |

FOREIGN PATENT DOCUMENTS

| CN | 101460813 B | 12/2010 |
| CN | 1790047 B | 10/2012 |

(Continued)

*Primary Examiner* — Giovanni Astacio-Oquendo
(74) *Attorney, Agent, or Firm* — Jun He Law Offices P.C.; James J. Zhu

(57) ABSTRACT

The present invention relates to a method for calibrating a channel delay skew of automatic test equipment (ATE), the method comprising: providing multiple calibration reference devices, wherein the calibration reference devices have a second plurality of delay paths each having a predetermined path delay value and coupling a pair of pins of one of the calibration reference devices together, wherein each pin is coupled to at most one delay path; coupling each of the calibration reference devices with the ATE, respectively, wherein the test probe of each of the first plurality of test channels is coupled with a pin of one of the calibration reference devices; testing the calibration reference devices to obtain multiple delay measurements from one or more transmitting channels of the first plurality of test channels to one or more receiving channels of the first plurality of test channels using the ATE; and calculating based on the delay measurements.

13 Claims, 4 Drawing Sheets

(51) Int. Cl.
*G01R 31/3193* (2006.01)
*G01R 31/317* (2006.01)

(52) U.S. Cl.
CPC ............... *G01R 31/31937* (2013.01); *G01R 31/318328* (2013.01)

(58) Field of Classification Search
CPC ............ G01R 31/31726; G01R 35/007; G01R 31/31922; G01R 31/3191; G01R 31/2851
USPC ................. 324/750.02, 750.01, 537, 500
See application file for complete search history.

(56) References Cited

FOREIGN PATENT DOCUMENTS

| | | |
|---|---|---|
| CN | 104422801 A | 3/2015 |
| TW | 200623298 A | 7/2006 |

\* cited by examiner

METHOD FOR CALIBRATING CHANNEL DELAY SKEW OF AUTOMATIC TEST EQUIPMENT

FIELD OF THE INVENTION

The disclosure generally relates to testing technology for integrated circuit chips, and more specifically, to a method for calibrating a channel delay skew of automatic test equipment (ATE).

BACKGROUND

After an integrated circuit chip is manufactured, it is necessary to carry out various performance and failure tests, which can usually be conducted by automatic test equipment. However, with the improvement of chip integration and speed, a lot of test equipment cannot meet the requirements of chip testing.

For example, for some chips, it is necessary to conduct source synchronization bus characteristics test, wherein one of key parameters is skew measurement. For a register clock driver chip of DDR4-3200 standard, a parallel bus consists of 33 command/address signals whose skew cannot exceed ±62.5 ps. However, even for the most advanced test equipment, its skew test accuracy can only reach approximately 116 ps, which is far to meet the needs of testing the chip of DDR4-3200 standard.

Therefore, it is necessary to improve the existing test equipment or method.

SUMMARY

An objective of the present application is to provide a method for calibrating a channel delay skew of ATE to reduce measurement error of the ATE through calibration.

In a first aspect of the present application, a method for calibrating a channel delay skew of an ATE is provided. The ATE having a first plurality of test channels to be calibrated, wherein each of the first plurality of test channels has a test probe for coupling with a device under test (DUT), and at least one of a test signal transmitter and a test signal receiver, the method comprising: providing multiple calibration reference devices, wherein the calibration reference devices have a second plurality of delay paths each having a predetermined path delay value and coupling a pair of pins of one of the calibration reference devices together, wherein each pin is coupled to at most one delay path; coupling each of the calibration reference devices with the ATE, respectively, wherein the test probe of each of the first plurality of test channels is coupled with a pin of one of the calibration reference devices; testing, using the ATE, the calibration reference devices to obtain multiple delay measurements from one or more of transmitting channels of the first plurality of test channels to one or more receiving channels of the first plurality of test channels; and calculating, based on the delay measurements, a delay skew of a test channel of the first plurality of test channels, or a relative delay skew between two receiving channels or between two transmitting channels of the first plurality of test channels.

In a second aspect of the present application, a method for measuring an input-output delay of a DUT by an ATE is provided. The method comprises: testing the DUT using the ATE to obtain a path delay from a transmitting channel coupled with an input pin of the DUT to a receiving channel coupled with an output pin of the DUT; determining, using the method set forth in the first aspect above, a delay skew of the transmitting channel coupled with the input pin and a delay skew of the receiving channel coupled with the output pin; and calibrating the delay skew in the obtained path delay.

With the method for calibrating a channel delay skew of the present application, the test accuracy is greatly improved without changing the hardware structure of the ATE. The method is fully compatible with existing test equipment and test methods, and the cost of implementing the method is low.

The foregoing is the summary of the present application, which may be simplified, summarized, and details omitted. Therefore, a person skilled in the art should recognize that this part is merely an illustrative example and is not intended to limit the scope of the application in any way. This summary is neither intended to identify the key or required characteristics of the subject matter claimed to be protected nor is it intended to be an adjunct to determining the scope of the subject matter claimed to be protected.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE DRAWINGS

Figure 1:
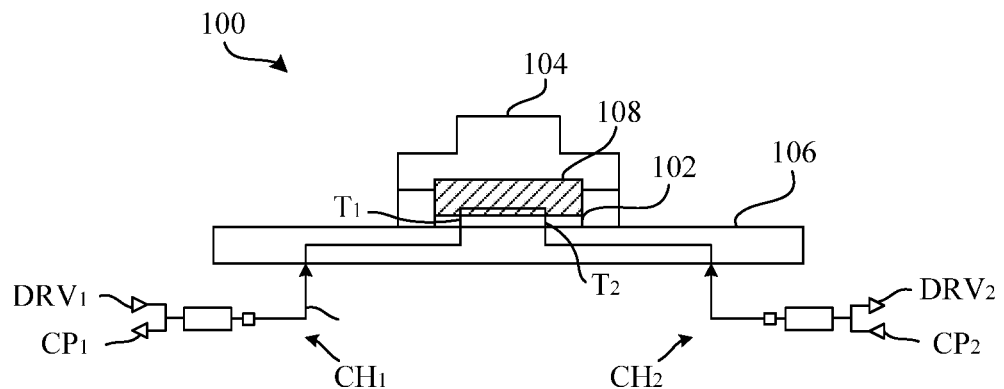
FIG. 1 is a schematic diagram of ATE 100 according to an embodiment of the present application.

In the following detailed description, the drawings that form part of it are referred to. In the drawings, similar symbols usually refer to like parts unless the context indicates otherwise. The illustrative embodiments described in the detailed description, drawings, and claims are not intended for limitation. Without deviation from the spirit or scope of the subject matter of the present application, other means of operation may be applied and other changes may be made. It can be understood that many different configurations, substitutions, combinations and designs can be made of various aspects of the contents of this application which are generally described in the application and illustrated in the drawings, and all of those aspects are explicitly incorporated into the contents of this application.

FIG. 1 is a schematic diagram of ATE 100 according to an embodiment of the present application, wherein a device under test (DUT) or a calibration reference device may be connected between two channels of the ATE 100. The DUT or the calibration reference device has one or more input pins and one or more output pins. The input pin is used for receiving a test signal from the ATE 100, and a signal response is output from a corresponding output pin in response to the test signal. It can be understood that, depending on the specific circuit structure of the DUT or calibration reference device coupled, there is a delay between the inputting of the test signal and the outputting of the signal response.

As illustrated in FIG. 1, the ATE 100 has a plurality of test channels $CH_i$, including the illustrated two channels $CH_1$ and $CH_2$, wherein i=1, 2, ..., N (N is a natural number). The channels each has a test probe, such as test probes $T_1$ and $T_2$ as illustrated in FIG. 1, for coupling with a DUT or calibration reference device, and the test probes are embedded in a contact pad 102 of the ATE 100. The contact pad 102 is configured as a part of a device socket 104, which has a shape that matches the DUT or the calibration reference device for accommodating the DUT or the calibration reference device 108 during the test. The DUT or the calibration reference device generally has pins that match with the test probes of the device socket 104, so that each of the pins is electrically coupled to a test probe when placed in the socket 104. In an embodiment illustrated in FIG. 1, the device socket 104 is mounted on a test circuit board 106 of the ATE 100.

Each channel of the ATE 100 also has at least one of a test signal transmitter for sending a test signal to the DUT and a test signal receiver for receiving a response of the test signal from the DUT. In some embodiments, one or more channels may include both of the test signal transmitter and the test signal receiver to transmit a test signal or receive a response to the test signal according to the test need. For example, in the embodiment illustrated in FIG. 1, the channel $CH_1$ has a test signal transmitter $DRV_1$ and a test signal receiver $CP_1$, and the channel $CH_2$ has a test signal transmitter $DRV_2$ and a test signal receiver $CP_2$. In other words, when a test signal transmitter of a channel is enabled, the test channel serves as a transmitting channel, and when a test signal receiver of a channel is enabled, the test channel serves as a receiving channel. It can be understood that, in some other embodiments, one channel may have only a test signal transmitter, and another channel may have only a test signal receiver. In other embodiments, a channel may serve as both the transmitting channel and the receiving channel, and a pin of the DUT to which the channel is coupled is an input/output pin.

It can be seen that for each test channel, a path from its signal port (that is, the location of the test signal transmitter or test signal receiver) to the test probe is determined, so its corresponding channel path delay value is also basically constant, and will not change along with the signal. In some embodiments, the channel path delay value for each test channel can be measured using a time domain reflectometry. However, in addition to channel path delay, there also exists delay skew in each test channel which will also affect the measurement accuracy. Therefore, in order to measure the DUT accurately, it is desired to determine the delay skew of each test channel.

To determine a delay skew in each test channel, or a relative delay skew between every two test channels of the same type, in some embodiments of this application, a plurality of calibration reference devices 108 are inserted in the device socket 104 of the ATE 100. The calibration reference devices have known delay values, so they can be used for determining the delay skew, thereby eliminating the delay skew through calibration in the subsequent measurement process.

In some embodiments, the calibration reference device 108 may have a plurality of pins $P_i$ for connecting the test channel $CH_i$ of the ATE 100 respectively. In addition, the calibration reference device 108 has multiple delay paths, each of which has a predetermined path delay value, wherein each delay path is connected to a pair of pins of the plurality of pins $P_i$. In some embodiments, each pin is coupled to at most one delay path. Therefore, in order to measure or calibrate the delay skew of a test channel, a relative delay skew between the test channel and another test channel can be measured and calculated. Specifically, two or more calibration reference devices can be coupled to the same test channel, wherein pins (which can be coupled to the same test channel of the ATE) at the same position of the two or more calibration reference devices can respectively be coupled to pins at other positions through different delay paths. Thus, for two or more different test channels coupled by two or more delay paths of different calibration reference devices, the relative delay skew(s) between the test channels can be calculated. It shall be noted that the number of pins and delay paths for a calibration reference device depends on the number of test channels that need to be calibrated. In some embodiments, the number of test channels that need to be calibrated may be a part of the test channels of the ATE 100. In other embodiments, the number of test channels that need to be calibrated can be the entirety of test channels of the ATE 100. Accordingly, depending on the calibration requirements, different calibration reference devices can be selected for calibration.

Figure 2A:
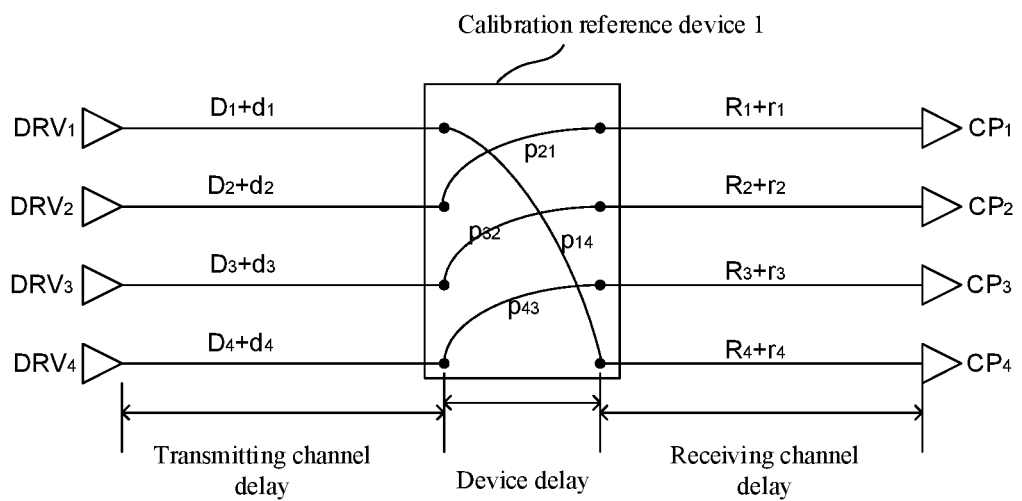
FIG. 2a and FIG. 2b, respectively, are schematic diagrams of four transmitting channels and four receiving channels coupled to two calibration reference devices with respective delay paths.
Figure 2B:
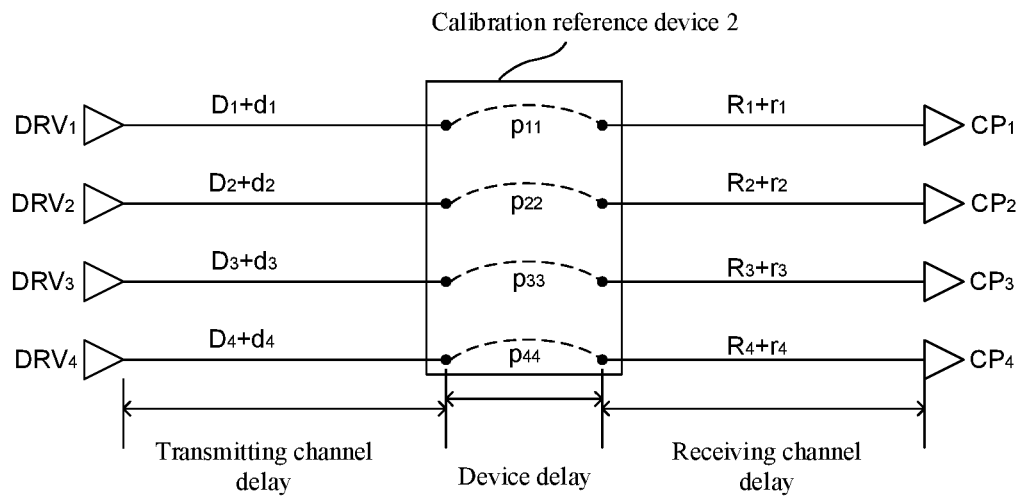

FIG. 2a and FIG. 2b, respectively, are schematic diagrams of two calibration reference devices coupled between four transmitting channels $DRV_1$ to $DRV_4$ and four receiving channels $CP_1$ to $CP_4$, wherein the two calibration reference devices have respective delay paths. FIG. 2a is the schematic diagram of a calibration reference device 1 with four delay paths coupled between the transmitting channels and the receiving channels; and FIG. 2b is the schematic diagram of a calibration reference device 2 with four delay paths coupled between the transmitting channels and the receiving channels. The calibration reference device 1 and the calibration reference device 2 can be successively connected to the ATE. It should be noted that in practical applications, the eight delay paths of the two calibration reference devices can also be distributed among three or more calibration reference devices, and one pin on each calibration reference device is coupled to at most one delay path.

As illustrated in FIGS. 2a and 2b, the calibration reference device 1 and the calibration reference device 2 have a total of eight delay paths, and each delay path is coupled to a pair of pins so that the calibration reference device is connected to the corresponding transmitting and receiving channels via the coupled pins.

Specifically, in FIG. 2a, a delay path $p_{21}$ of the calibration reference device 1 is coupled between a second transmitting channel $DRV_2$ and a first receiving channel $CP_1$, a delay path $p_{32}$ is coupled between a third transmitting channel $DRV_3$ and a second receiving channel $CP_2$, a delay path $p_{43}$ is coupled between a fourth transmitting channel $DRV_4$ and a third receiving channel $CP_3$, and a delay path $p_{14}$ is coupled between a first transmitting channel $DRV_1$ and a fourth receiving channel $CP_4$. In FIG. 2b, a delay path $p_{11}$ of the calibration reference device 2 is coupled between a first transmitting channel $DRV_1$ and a first receiving channel $CP_1$, a delay path $p_{22}$ is coupled between a second transmitting channel $DRV_2$ and a second receiving channel $CP_2$, a delay path $p_{33}$ is coupled between a third transmitting channel $DRV_3$ and a third receiving channel $CP_3$, and a delay path $p_{44}$ is coupled between a fourth transmitting channel $DRV_4$ and a fourth receiving channel $CP_4$. It can be seen that each test channel is coupled successively to two different delay paths on different calibration reference devices.

Figure 3:
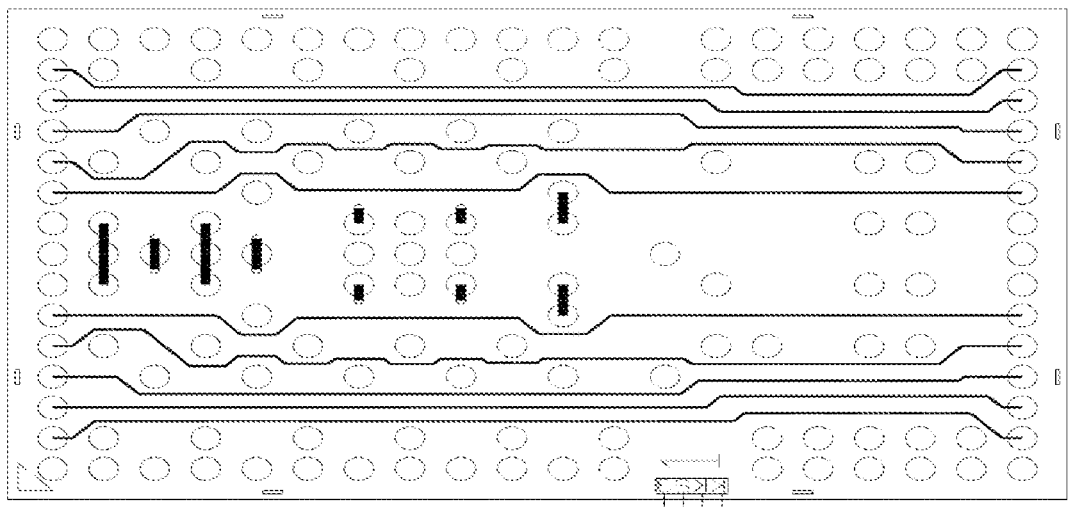
FIG. 3 illustrates a trace of an exemplary conductive circuit on the circuit board of a calibration reference device.

In some embodiments, a calibration reference device may include a package structure (a dummy package) for an integrated circuit; however, instead of the integrated circuit chip, a printed circuit board is packaged in the package structure. The printed circuit board is arranged with conductive lines or similar structures, which are designed to have specific traces, thereby forming delay path(s) each having a predetermined path delay value. FIG. 3 illustrates traces of exemplary conductive lines on the circuit board of a calibration reference device. A person skilled in the art can understand that these lines can be adjusted to obtain different path delay values depending on the actual application. In other embodiments, different passive resistive, capacitive, or inductive elements, or other elements may be inserted in the conductive lines to adjust the path delay value of the delay path.

Still refer to FIGS. 2a and 2b, for a transmitting-receiving path (from $DRV_m$ to $CP_n$) that includes a delay path $p_{mn}$, a total delay $T_{mn}$ indicates a delay value from the $m^{th}$ transmitting channel $DRV_m$ to the $n^{th}$ receiving channel $CP_n$. In FIGS. 2a and 2b, m has a value of 1 to 4 corresponding to 4 transmitting channels and n has a value of 1 to 4 corresponding to 4 receiving channels. It could be understood that in different cases, the values of m and n may depend on the respective numbers of transmitting and receiving channels. In practice, the total delay $T_{mn}$ can be determined by measurement. Furthermore, the total delay $T_{mn}$ can theoretically be expressed by the following equation (1):

$$T_{mn} = D_m + d_m + p_{mn} + R_n + r_n. \tag{1}$$

wherein $D_m$ represents a channel path delay value of the transmitting channel $DRV_m$, which can be measured using time domain reflectometry; $d_m$ represents a delay skew of the transmitting channel $DRV_m$; $p_{mn}$ represents a predetermined path delay value of the corresponding delay path in the calibration reference device; $R_n$ represents a channel path delay value of the receiving channel $CP_n$, which can also be measured using time domain reflectometry; $r_n$ represents a delay skew of the receiving channel $CP_n$.

In equation (1), since both the channel path delay values $D_m$ and $R_n$ can be predetermined through measurement, these two parameters can be calibrated in the total delay $T_{mn}$, leaving only the parameters $d_m$ and $r_n$ to be determined, that is:

$$T_{mn}' = T_{mn} - (D_m + R_n) = d_m + p_{mn} + r_n \tag{2}$$

wherein, $T_{mn}'$ is the total delay after calibration.

Based on the equation (2) above, the circuits shown in FIGS. 2a and 2b may be constructed as a multivariate equation set (3) that follows:

$$\begin{cases} T_{11}' = d_1 + p_{11} + r_1 \\ T_{21}' = d_2 + p_{21} + r_1 \\ T_{22}' = d_2 + p_{22} + r_2 \\ T_{32}' = d_3 + p_{32} + r_2 \\ T_{33}' = d_3 + p_{33} + r_3 \\ T_{43}' = d_4 + p_{43} + r_3 \\ T_{44}' = d_4 + p_{44} + r_4 \\ T_{14}' = d_1 + p_{14} + r_4 \end{cases} \tag{3}$$

The above equation set (3) may undergo equation transformation to obtain an equation set (4) that follows:

$$\begin{cases} T_{11}' - p_{11} = d_1 + r_1 \\ T_{21}' - p_{21} = d_2 + r_1 \\ T_{22}' - p_{22} = d_2 + r_2 \\ T_{32}' - p_{32} = d_3 + r_2 \\ T_{33}' - p_{33} = d_3 + r_3 \\ T_{43}' - p_{43} = d_4 + r_3 \\ T_{44}' - p_{44} = d_4 + r_4 \\ T_{14}' - p_{14} = d_1 + r_4 \end{cases} \tag{4}$$

wherein each parameter on the left side of the equations of equation set (4) is a known value, and parameters on the right side of the equations are respectively the delay skews to be determined. Further, the equations in equation set (4) are subtracted from one another to eliminate the common delay skews. By subtracting the first and second equations in the equation set (4), the common delay skew $r_1$ of the first receiving channel on the right side of the equations can be eliminated. Similarly, by subtracting the second and third equations in the equation set (4), the common delay skew $d_2$ of the second transmitting channel on the right side of the equations can be eliminated. The subtraction of other equations is similar. It can be understood that in practical applications, the delay skew of each receiving channel, or the delay skew of each transmitting channel can be selectively eliminated as needed.

As an example, the following equation set (5) illustrates relative delay skews between four pairs of receiving channels after eliminating the delay skews of the transmitting channels:

$$\begin{cases} r_1 - r_4 = (T_{11}' - p_{11}) - (T_{14}' - p_{14}) \\ r_2 - r_1 = (T_{22}' - p_{22}) - (T_{21}' - p_{21}) \\ r_3 - r_2 = (T_{33}' - p_{33}) - (T_{32}' - p_{32}) \\ r_4 - r_3 = (T_{44}' - p_{44}) - (T_{43}' - p_{43}) \end{cases} \tag{5}$$

Specifically, $r_1-r_4$ represents a relative delay skew between the first receiving channel $CP_1$ and the fourth receiving channel $CP_4$; $r_2-r_1$ represents a relative delay skew between the second receiving channel $CP_2$ and the first receiving channel $CP_1$; $r_3-r_2$ represents a relative delay skew between the third receiving channel $CP_3$ and the second receiving channel $CP_2$; $r_4-r_3$ represents a relative delay skew between the fourth receiving channel $CP_4$ and the third receiving channel $CP_3$. The relative delay skews between other receiving channels can be calculated. For example, a relative delay skew between the second receiving channel $CP_2$ and the fourth receiving channel $CP_4$ can be obtained by summing $(r_1-r_4)$ and $(r_2-r_1)$.

It can be seen that in equation set (5), $T_{mn}'$ is the total delay after calibration, which can be obtained by measurement and calculation; and $p_{mn}$ is the path delay value of the delay path in the calibration reference device, which can also be predetermined. Therefore, the relative delay skew between every two receiving channels can be calculated.

In equation set (5), the delay skew of the transmitting channel is eliminated, and only the relative delay skews between the receiving channels are calculated. Based on a similar algorithm, the delay skews of the receiving channels can be eliminated to calculate the relative delay skew between each two transmitting channels.

In other embodiments, the delay skew of each test channel can also be calculated directly from equation set (4).

In practical applications, these calibration reference devices can also employ delay paths other than those illustrated in FIGS. 2a and 2b. In another example, the delay paths of the calibration reference device can be designed as any other suitable path, such as $p_{31}$, $p_{42}$, $p_{13}$, and $p_{24}$, to connect the corresponding transmitting channels and receiving channels. These delay paths can also be used to calculate the relative delay skew between every two receiving channels.

It should be noted that, the embodiments shown in FIGS. 2a and 2b are illustrated in the way that every relative delay skew between each two of the receiving channels and between each two of the transmitting channels is required to be calibrated. In some embodiments, only a relative delay skew between two receiving channels needs to be calibrated, or only a relative delay skew between two transmitting channels needs to be calibrated. In this case, the two calibration reference devices that are provided for calibration may include only two delay paths, that is, one delay path is provided on each calibration reference device, and the two delay paths are connected to two transmitting channels and a common receiving channel (for determining the relative delay skew between the two transmitting channels), or connected to two receiving channels and a common transmitting channel (for determining a relative delay skew between the two receiving channels).

Figure 4A:
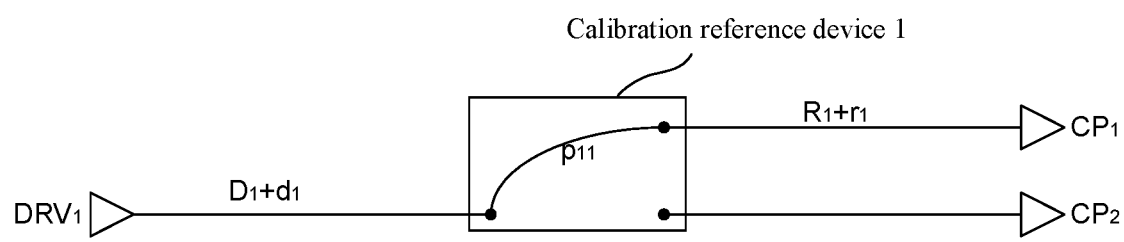
FIG. 4a and FIG. 4b, respectively, are schematic diagrams of a transmitting channel and two receiving channels coupled to two calibration reference devices with respective delay paths.
Figure 4B:
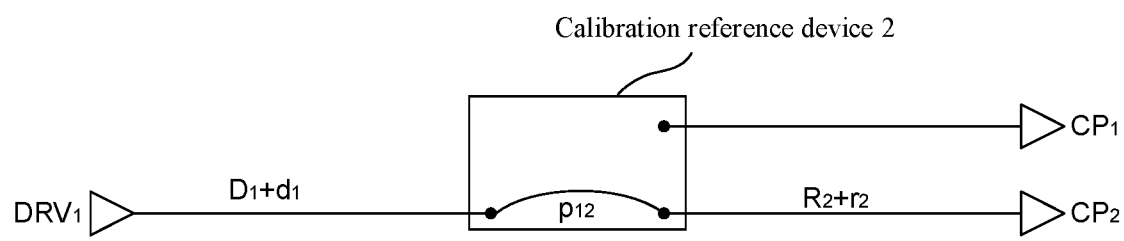

FIGS. 4a and 4b are schematic diagrams illustrating one transmitting channel and two receiving channels coupled to two calibration reference devices with respective delay paths.

As illustrated in FIGS. 4a and 4b, the circuit includes a transmitting channel $DRV_1$ and two receiving channels $CP_1$ and $CP_2$. In order to determine a relative delay skew between the two receiving channels, the calibration reference device 1 and calibration reference device 2 include delay paths $p_{11}$ and $p_{12}$, respectively. The delay path $p_{11}$ is coupled between the transmitting channel $DRV_1$ and the receiving channel $CP_1$, and the delay path $p_{12}$ is coupled between the transmitting channel $DRV_1$ and the receiving channel $CP_2$.

In order to calculate the relative delay skew between the two receiving channels $CP_1$ and $CP_2$, it is desired to measure a total delay $T_{11}$ (including the delay path $p_{11}$) from the transmitting channel $DRV_1$ to the receiving channel $CP_1$, and the total delay $T_{12}$ (including the delay path $p_{12}$) from the transmitting channel $DRV_1$ to the receiving channel $CP_2$.

Accordingly, the delay measurements $T_{11}$ and $T_{12}$ can be represented by equation (1), and then the relative delay skew between the two receiving channels is represented by equation (6) below:

$$(r_1-r_2)=(T_{11}-p_{11}-D_1-d_1-R_1)-(T_{12}-p_{12}-D_1-d_1-R_2)= (T_1-p_{11}-R_1)-(T_{12}-p_{12}-R_2) \quad (6)$$

wherein $p_{11}$ and $p_{12}$ are the path delay values of the corresponding delay paths, respectively, and $R_1$ and $R_2$ are the channel path delay values of the corresponding receiving channels, which can also be measured using time domain reflectometry.

As such, the relative delay skew of the two receiving channels can be calculated.

It can be seen that in order to calculate the delay skew of different test channels or the relative delay skew between channels, it is only required to construct an equation set for the test channels to be calibrated, and in the equation set, some predetermined values are determined through measurement and designing the calibration reference device. As long as the constructed equation set is solvable, the delay skew of the channel or the relative delay skew between channels can be calculated.

Figure 5:
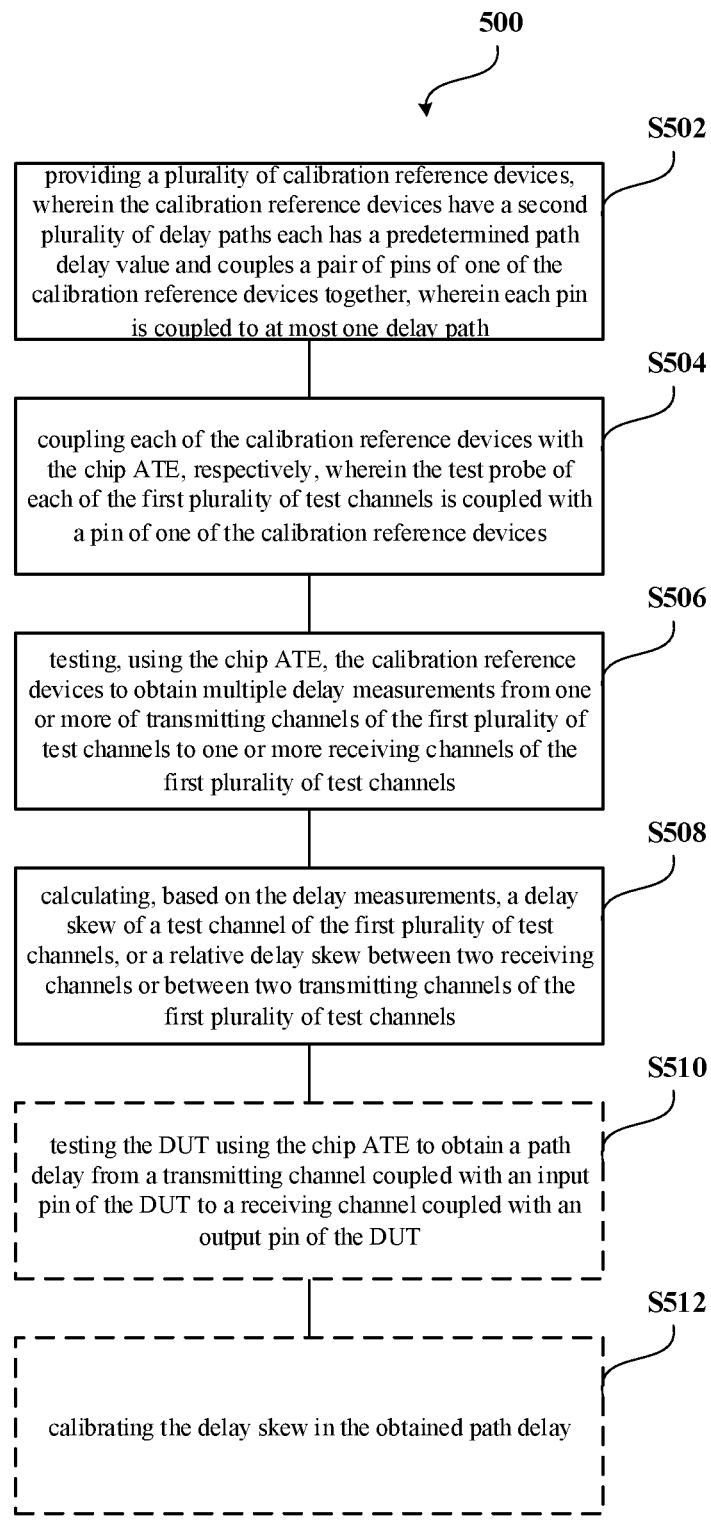
FIG. 5 illustrates a calibration method according to one embodiment of the present application.

FIG. 5 illustrates a calibration method according to an embodiment of the present application. The calibration method can be applied to the ATE illustrated in FIG. 1. The ATE has a first plurality of test channels $CH_i$ to be calibrated, wherein i=1, 2, . . . N, N is a natural number. Each of the first plurality of test channels $CH_i$ has a test probe for coupling with a device under test (DUT), and at least one of a test signal transmitter and a test signal receiver.

As shown in FIG. 5, the calibration method includes: step S502, providing a plurality of calibration reference devices, wherein the calibration reference devices have a second plurality of delay paths each has a predetermined path delay value and couples a pair of pins of one of the calibration reference devices together, wherein each pin is coupled to at most one delay path; step S504, coupling each of the calibration reference devices with the ATE, respectively, wherein the test probe of each of the first plurality of test channels is coupled with a pin of one of the calibration reference devices; step S506, testing, using the ATE, the calibration reference devices to obtain multiple delay measurements from one or more of transmitting channels of the first plurality of test channels to one or more of receiving channels of the first plurality of test channels; and step S508, calculating, based on the delay measurements, a delay skew of a test channel of the first plurality of test channels, or a relative delay skew between two receiving channels or between two transmitting channels of the first plurality of test channels.

In some embodiments, each test channel is coupled with at least two delay paths, wherein the at least two delay paths are disposed on at least two calibration reference devices respectively; wherein the delay measurements include delay measurements from each transmitting channel to at least two receiving channels via the at least two delay paths and delay measurements from at least two transmitting channels to each receiving channel via the at least two delay paths.

In some embodiments, a test channel is coupled with at least two delay paths, wherein the at least two delay paths are disposed on at least two calibration reference devices, respectively; wherein the delay measurements include at least two delay measurements via the at least two delay paths, such that a relative delay skew between test channels of a same type that are coupled with the at least two delay paths can be calculated based on the at least two delay measurements.

Alternatively, the method shown in FIG. 5 can be used to measure the input-output delay of the DUT. Correspondingly, the method further includes: step S510, testing the DUT using the ATE to obtain a path delay from a transmitting channel coupled with an input pin of the DUT to a receiving channel coupled with an output pin of the DUT; and step S512, calibrating the delay skew in the obtained path delay.

Based on the calibration method of the present application, the inventors of the present application calibrated an existing ATE. The timing measurement accuracy of the ATE is approximately ±116 ps without using the calibration method of the present application. Then the inventors calibrated the ATE using the calibration method of the present application. Specifically, the inventors designed 11 calibration reference devices (dummy packages), with 10 delay paths on each of the calibration reference devices. Using the calibration reference devices, the inventors tested the delay skews of 11 pairs of channels (11 transmitting channels and 11 receiving channels, which transmit and receive signals in an interleaving manner), 12 pairs of channels (12 transmitting channels and 12 receiving channels, which transmit and receive signals in an interleaving manner), 13 pairs of channels (13 transmitting channels and 13 receiving channels, which transmit and receive signals in an interleaving manner) and 14 pairs of channels (14 transmitting channels and 14 receiving channels, which transmit and receive signals in an interleaving manner). Among them, a skew standard deviation of the 11 pairs of channels is ±7.8 ps, and the corresponding skew standard deviation of a single channel is ±2.4 ps (7.8/$\sqrt{11}$); a skew standard deviation of the 12 pairs of channels is ±9.6 ps, and the corresponding skew standard deviation of a single channel is ±2.8 ps (9.6/$\sqrt{12}$); a skew standard deviation of the 13 pairs of channels is ±11.1 ps, and the corresponding skew standard deviation of a single channel is ±3.1 ps (11.1/$\sqrt{13}$); a skew standard deviation of the 14 pairs of channels is ±11.5 ps, and the corresponding skew standard deviation of a single channel is ±3.1 ps (11.5/$\sqrt{14}$). According to the 3σ standard (with a confidence of 99.7%), the measurement error is at most ±9.3 ps, which is much smaller than the uncalibrated single channel skew error of ±116 ps.

As for the calibration method of the present application, the test accuracy is greatly improved without changing the hardware structure of the test equipment, and it is fully compatible with the existing test equipment and test methods. The only thing that needs extra preparation is the calibration reference devices, therefore the cost to realize the method of the present application is relatively low.

An ordinary person skilled in the art may understand and implement other changes on the ways of implementation disclosed by studying the specification, the disclosed contents and accompanying drawings, and the claims attached. In the claims, the expression "including" does not exclude other elements or steps, and the expressions "a" and "one" do not exclude the plural. In the actual application of the present application, a component may perform the functions of several technical features cited in the claim. Any reference to the drawings in the claim shall not be construed as a limitation on the scope.

What is claimed is:

1. A method for calibrating a channel delay skew of automatic test equipment (ATE), the ATE having a first plurality of test channels to be calibrated, wherein each of the first plurality of test channels has a test probe for coupling with a device under test (DUT), and at least one of a test signal transmitter and a test signal receiver, the method comprising:

providing multiple calibration reference devices, wherein the calibration reference devices have a second plurality of delay paths each having a predetermined path delay value and coupling a pair of pins of one of the calibration reference devices together, and wherein each pin is coupled to at most one delay path;

coupling each of the calibration reference devices with the ATE respectively, wherein the test probe of each of the first plurality of test channels is coupled with a pin of one of the calibration reference devices;

testing, using the ATE, the calibration reference devices to obtain multiple delay measurements from one or more transmitting channels of the first plurality of test channels to one or more receiving channels of the first plurality of test channels; and calculating, based on the delay measurements, a delay skew of a test channel of the first plurality of test channels, or a relative delay skew between two receiving channels or between two transmitting channels of the first plurality of test channels.

2. The method according to claim 1, wherein the step of testing, using the ATE, the calibration reference devices comprises:

coupling each test channel with at least two delay paths of the delay paths, wherein the at least two delay paths are disposed on at least two calibration reference devices respectively; wherein the delay measurements include delay measurements from each transmitting channel to at least two receiving channels via the at least two delay paths and delay measurements from at least two transmitting channels to each receiving channel via the at least two delay paths.

3. The method according to claim 1, wherein the step of testing, using the ATE, the calibration reference devices comprises:

coupling a test channel with at least two delay paths, wherein the at least two delay paths are disposed on at least two calibration reference devices, respectively; wherein the delay measurements include at least two delay measurements via the at least two delay paths, such that a relative delay skew between test channels of a same type that are connected with the at least two delay paths can be calculated based on the at least two delay measurements.

4. The method according to claim 1, wherein each of the test channels has a predetermined channel path delay value.

5. The method according to claim 4, further comprising:
measuring the channel path delay value of each of the test channels using a time domain reflectometry.

6. The method according to claim 1, wherein the transmitting channel is a test channel with its test signal transmitter enabled, and the receiving channel is a test channel with its test signal receiver enabled.

7. The method according to claim 1, wherein the first plurality of test channels is a part or all of test channels of the ATE.

8. The method according to claim 1, wherein each calibration reference device is a package structure without an integrated circuit chip loaded therein.

9. The method according to claim 1, wherein each calibration reference device includes a printed circuit board without an integrated circuit chip.

10. The method according to claim 9, wherein each delay path is a conductive trace on the printed circuit board.

11. The method according to claim 1, wherein the step of calculating, based on the delay measurements, the delay skew of the test channel of the first plurality of test channels, or a relative delay skew between two receiving channels or between two transmitting channels of the first plurality of test channels comprises:

constructing an equation set based on the delay measurements and the predetermined path delay values of the second plurality of delay paths; and solving the equation set to obtain the delay skew of the test channel, or to obtain the relative delay skew between the two receiving channels or between the two transmitting channels.

12. The method according to claim 11, wherein each of the test channels has a predetermined channel path delay value, and constructing the equation set comprises:

pre-calibrating the channel path delay values in the delay measurements and constructing the equation set using the calibrated delay measurements and the predetermined path delay values.

13. A method for measuring an input-output delay of a device under test (DUT) by automatic test equipment (ATE), the method comprising:
  testing the DUT using the ATE to obtain a path delay from a transmitting channel coupled with an input pin of the DUT to a receiving channel coupled with an output pin of the DUT;
  determining, using the method according to claim 1, a delay skew of the transmitting channel coupled with the input pin and a delay skew of the receiving channel coupled with the output pin; and
  calibrating the delay skew in the obtained path delay.

\* \* \* \* \*